(12) United States Patent
Wang et al.

(10) Patent No.: US 10,453,897 B2
(45) Date of Patent: Oct. 22, 2019

(54) OLED DISPLAY SUBSTRATE, TOUCH DISPLAY PANEL AND DISPLAY DEVICE

(71) Applicant: BOE Technology Group Co., Ltd., Beijing (CN)

(72) Inventors: Long Wang, Beijing (CN); Libin Liu, Beijing (CN); Pan Li, Beijing (CN); Jiayang Zhao, Beijing (CN); Chun Jan Wang, Beijing (CN); Li Zhou, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/310,504

(22) PCT Filed: Mar. 28, 2016

(86) PCT No.: PCT/CN2016/077486
§ 371 (c)(1),
(2) Date: Nov. 11, 2016

(87) PCT Pub. No.: WO2016/165551
PCT Pub. Date: Oct. 20, 2016

(65) Prior Publication Data
US 2017/0084668 A1 Mar. 23, 2017

(30) Foreign Application Priority Data
Apr. 13, 2015 (CN) .......................... 2015 1 0172765

(51) Int. Cl.
*H01L 27/28* (2006.01)
*H01L 27/32* (2006.01)
(Continued)

(52) U.S. Cl.
CPC .......... *H01L 27/288* (2013.01); *G06F 3/0412* (2013.01); *G06F 3/0416* (2013.01);
(Continued)

(58) Field of Classification Search
CPC ... H01L 27/288; H01L 27/32; H01L 27/3227; H01L 27/323; G06F 2/0412;
(Continued)

(56) References Cited

U.S. PATENT DOCUMENTS

2002/0186209 A1 12/2002 Cok
2010/0078230 A1* 4/2010 Rosenblatt .............. G06F 3/041
178/18.01
(Continued)

FOREIGN PATENT DOCUMENTS

CN 201285541 Y 8/2009
CN 102379002 A 3/2012
(Continued)

OTHER PUBLICATIONS

Dec. 2, 2015—(CN) First Office Action Appn 201510172765.8 with English Tran.
(Continued)

*Primary Examiner* — Mark W Regn
(74) *Attorney, Agent, or Firm* — Banner & Witcoff, Ltd.

(57) ABSTRACT

An OLED display substrate, a touch display panel and a display device are provided. The OLED display substrate has a base substrate and a display region, the display region includes: a plurality of first sub-regions arranged at intervals and second sub-regions located between the first sub-regions; at least one OLED light-emitting unit located in the first sub-regions; a plurality of optical sensing units located in the second sub-regions, and first drive electrode lines and first transmission electrode lines connected with the optical sensing units and intersecting with each other; wherein, the optical sensing unit includes a photosensitive sensor, and the photosensitive sensor is configured to generate an electric signal according to a light intensity change of a sensed touch point; and the first drive electrode line and the first transmission electrode line are configured to provide the electric signal to determine a position of the touch point.

18 Claims, 7 Drawing Sheets

(51) Int. Cl.
*G06F 3/041* (2006.01)
*G06F 3/042* (2006.01)

(52) U.S. Cl.
CPC ............ *G06F 3/0421* (2013.01); *H01L 27/32* (2013.01); *H01L 27/323* (2013.01); *H01L 27/3227* (2013.01); *G06F 2203/04102* (2013.01); *G06F 2203/04111* (2013.01)

(58) Field of Classification Search
CPC ................ G06F 2/0416; G06F 2/0421; G06F 2203/04102; G06F 2203/04111
USPC ......................................................... 345/175
See application file for complete search history.

(56) References Cited

U.S. PATENT DOCUMENTS

| | | | | |
|---|---|---|---|---|
| 2012/0176298 A1* | 7/2012 | Suh | ..................... | H01L 27/3234 345/82 |
| 2013/0194199 A1* | 8/2013 | Lynch | ................... | G06F 3/0412 345/173 |
| 2014/0145979 A1* | 5/2014 | Lee | ........................ | G06F 3/0412 345/173 |
| 2014/0160047 A1* | 6/2014 | Choi | ..................... | G06F 3/0412 345/173 |
| 2016/0253012 A1* | 9/2016 | Yang | ....................... | G06F 3/041 345/175 |

FOREIGN PATENT DOCUMENTS

| | | |
|---|---|---|
| CN | 102592514 A | 7/2012 |
| CN | 103176676 A | 6/2013 |
| CN | 104102382 A | 10/2014 |
| CN | 104793812 A | 7/2015 |

OTHER PUBLICATIONS

May 27, 2016—(CN) Second Office Action Appn 201510172765.8 with English Tran.
Oct. 19, 2016—(CN) Third Office Action Appn 201510172765.8 with English Tran.
Jul. 4, 2016—(WO) International Search Report and Written Opinion Appn PCT/CN2016/077486 with English Tran.

* cited by examiner

OLED DISPLAY SUBSTRATE, TOUCH DISPLAY PANEL AND DISPLAY DEVICE

The application is a U.S. National Phase Entry of International Application No. PCT/CN2016/077486 filed on Mar. 28, 2016, designating the United States of America and claiming priority to Chinese Patent Application No. 201510172765.8 filed on Apr. 13, 2015. The present application claims priority to and the benefit of the above-identified applications and the above-identified applications are incorporated by reference herein in their entirety.

TECHNICAL FIELD

Embodiments of the present disclosure relate to an OLED display substrate, a touch display panel and a display device.

BACKGROUND

In an existing Organic Light-Emitting Display (OLED) touch product, generally speaking, a touch panel is externally hung on a light-emitting side of an OLED display panel.

SUMMARY

Embodiments of the present disclosure provide an Organic Light-Emitting Display (OLED) display substrate, comprising a base substrate and a display region, the display region comprising: a plurality of first sub-regions arranged at intervals and second sub-regions located between the first sub-regions; at least one OLED light-emitting unit located in the first sub-regions; and a plurality of optical sensing units located in the second sub-regions, and first drive electrode lines and first transmission electrode lines connected with the optical sensing units and intersecting with each other; wherein, the optical sensing units each comprise a photosensitive sensor, and the photosensitive sensor is configured to generate an electric signal according to a light intensity change of a sensed touch point; and the first drive electrode lines and the first transmission electrode lines are configured to provide electric signals to determine a position of the touch point.

In one embodiment of the present disclosure, for example, the optical sensing units further comprise: solar cells connected with the first drive electrode lines and the first transmission electrode lines; first switching devices connected with the photosensitive sensors in series, the first switching devices being located on first branch circuits adopting the first drive electrode lines as buses, and the first switching devices being closer to signal input ends of the first drive electrode lines with respect to the photosensitive sensors; second switching devices connected with the solar cells in series, the second switching devices being located on second branch circuits which are connected with the first branch circuits in parallel, and the second switching devices being closer to the signal input ends of the first drive electrode lines with respect to the solar cells; the first drive electrode lines are configured to drive the solar cells to start; and the first transmission electrode lines are configured to output electric energy generated by the solar cells; wherein, the first switching devices and the second switching devices have opposite switching characteristics.

In one embodiment of the present disclosure, for example, the first sub-regions are arranged in matrix; the first drive electrode lines are located between first sub-regions of two adjacent rows, and the first transmission electrode lines are located between first sub-regions of two adjacent columns.

In one embodiment of the present disclosure, for example, the Organic Light-Emitting Display (OLED) display substrate further comprising: second drive electrode lines and second transmission electrode lines located in the second sub-regions; wherein, the optical sensing units further comprise: solar cells connected with the second drive electrode lines and the second transmission electrode lines; the second drive electrode lines are configured to drive the solar cells to start; and the second transmission electrode lines are configured to output electric energy generated by the solar cells.

In one embodiment of the present disclosure, for example, the first sub-regions are arranged in matrix; the first drive electrode lines and the second drive electrode lines are located between first sub-regions of two adjacent rows; the first transmission electrode lines and the second transmission electrode lines are located between first sub-regions of two adjacent columns.

In one embodiment of the present disclosure, for example, the OLED light-emitting unit comprises: a first electrode, an organic material functional layer and a second electrode sequentially arranged on the base substrate; the photosensitive sensor comprises: a third electrode, a first photoelectric conversion layer and a fourth electrode sequentially arranged on the base substrate; wherein, the first electrode and the second electrode are a cathode and an anode interchangeably; the third electrode and the fourth electrode are a cathode and an anode interchangeably; the third electrode, the first photoelectric conversion layer and the fourth electrode are respectively arranged in a same layer as the first electrode, the organic material functional layer and the second electrode.

In one embodiment of the present disclosure, for example, the third electrode, the first photoelectric conversion layer and the fourth electrode are respectively same as the first electrode, the organic material functional layer and the second electrode in thickness.

In one embodiment of the present disclosure, for example, the solar cell comprises: a fifth electrode, a second photoelectric conversion layer and a sixth electrode sequentially arranged on the base substrate; wherein, the fifth electrode and the sixth electrode are a cathode and an anode interchangeably; the fifth electrode, the second photoelectric conversion layer and the sixth electrode are respectively arranged in a same layer as the first electrode, the organic material functional layer and the second electrode.

In one embodiment of the present disclosure, for example, the fifth electrode, the second photoelectric conversion layer and the sixth electrode are respectively same as the first electrode, the organic material functional layer and the second electrode in thickness.

In one embodiment of the present disclosure, for example, the optical sensing units comprises the solar cells, the first switching devices and the second switching devices; the OLED light-emitting unit comprises a drive transistor located on the base substrate; wherein, the OLED display substrate further comprises a passivation layer covering the drive transistor, the first switching devices and the second switching devices; a drain electrode of the drive transistor is connected with the first electrode through a first via hole in the passivation layer; a drain electrode of the first switching device is connected with the third electrode through a second via hole in the passivation layer; and a drain electrode of the second switching device is connected with the fifth electrode through a third via hole in the passivation layer.

Embodiments of the present disclosure provide a touch display panel, comprising an encapsulation substrate and the OLED display substrate described above to be cell-assembled with the encapsulation substrate.

In one embodiment of the present disclosure, for example, in the touch display panel, a touch electrode layer located between the encapsulation substrate and the OLED display substrate; wherein, the touch electrode layer is configured to sense a touch signal at a conductor touch stage; the photosensitive sensor is configured to sense a touch signal at an insulator touch stage.

In one embodiment of the present disclosure, for example, in the touch display panel, the touch electrode layer comprises a touch driving electrode and a touch sensing electrode isolated by an insulating layer and intersecting with each other; wherein, the touch display panel is configured to meet at least one of two following conditions: an OLED light-emitting unit does not overlap with the touch driving electrode or the touch sensing electrode; and the optical sensing unit does not overlap with the touch driving electrode or the touch sensing electrode.

In one embodiment of the present disclosure, for example, in the touch display panel, five to ten of the OLED light-emitting units are arranged in the first sub-regions; the optical sensing unit is located at a position of a center region of every four adjacent first sub-regions.

In one embodiment of the present disclosure, for example, in the touch display panel, the touch electrode layer is located on a side of the encapsulation substrate facing the OLED display substrate, and the touch display panel further comprises: sealant located between the OLED display substrate and the encapsulation substrate; or, the touch electrode layer is located on a side of the encapsulation substrate facing the OLED display substrate, and the OLED display substrate further comprises an encapsulation layer for packaging the OLED light-emitting unit and the optical unit; or, the touch electrode layer is located on a side of the OLED display substrate facing the encapsulation substrate, and the touch display panel further comprises: an insulating layer located between the touch electrode layer and the OLED light-emitting unit as well as between the touch electrode layer and the optical unit, and sealant located between the OLED display substrate and the encapsulation substrate; or, the touch electrode layer is located on a side of the OLED display substrate facing the encapsulation substrate, and the OLED display substrate further comprises an insulating layer located between the touch electrode layer and the OLED light-emitting unit as well as between the touch electrode layer and the optical unit, and an encapsulation layer for encapsulating the touch electrode layer, the OLED light-emitting unit and the optical unit.

Embodiments of the present disclosure provide a display device, comprising the touch display panel described above.

BRIEF DESCRIPTION OF THE DRAWINGS

In order to clearly illustrate the technical solution of the embodiments of the disclosure, the drawings of the embodiments will be briefly described in the following, it is obvious that the described drawings are only related to some embodiments of the disclosure and thus are not limitative of the disclosure.

REFERENCE SIGNS

01—touch display panel; 10—OLED display substrate; 100—base substrate; 11—OLED light-emitting unit; 111—first electrode; 112—organic material functional layer; 113—second electrode; 12—optical sensing unit; 121—photosensitive sensor; 1211—third electrode; 1212—first photoelectric conversion layer; 1213—fourth electrode; 122—solar cell; 1221—fifth electrode; 1222—second photoelectric conversion layer; 1223—sixth electrode; 13—first drive electrode line; 131—first branch circuit; 132—second branch circuit; 14—first transmission electrode line; 15—first switching device; 16—second switching device; 17—second drive electrode line; 18—second transmission electrode line; 19—passivation layer; 191—first via hole; 192—second via hole; 193—third via hole; 20—defining layer; 201—first opening; 202—second opening; 203—third opening; 21—encapsulation substrate; 30—touch electrode layer; 31—touch driving electrode; 32—touch sensing electrode; 33—insulating layer; 40—sealant; 50—encapsulation layer.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
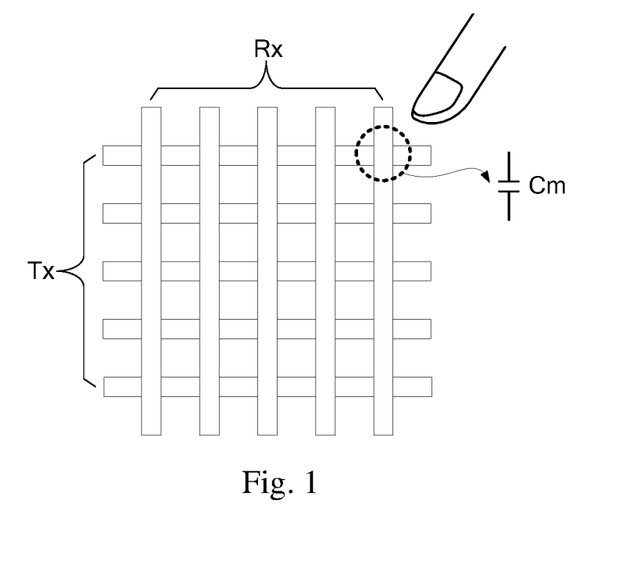
FIG. 1 is a schematic diagram of touch display principle of a capacitive touch display panel.

As shown in FIG. 1, touch sensing electrodes (Rx for short) and touch driving electrodes (Tx for short) insulating from each other and intersecting in rows and columns are integrated in a touch panel, and a touch principle of the touch panel utilizes conductive characteristics of human bodies themselves. When a finger touches a screen, touch position information of a touch point is acquired by detecting a numerical value change of coupling capacitance (Cm)

formed at intersections of the touch sensing electrodes (Rx) and the touch driving electrodes (Tx) in the touch panel.

However, because an OLED touch product senses a touch by sensing a change of coupling capacitance (Cm), when an insulating object touches a screen, the coupling capacitance (Cm) is not changed, and position information of a touch point cannot be acquired by detecting the change of the coupling capacitance (Cm). Thus, an insulator cannot achieve a touch function, and usability of the OLED touch product is limited to a certain extent. For example, when a user uses a smart product having a touch function in winter, because common gloves are not conductive, a capacitive touch product cannot be operated. Therefore, the user must remove the gloves to use a touch mobile phone, and consequently it is inconvenient for the user.

Figure 2:
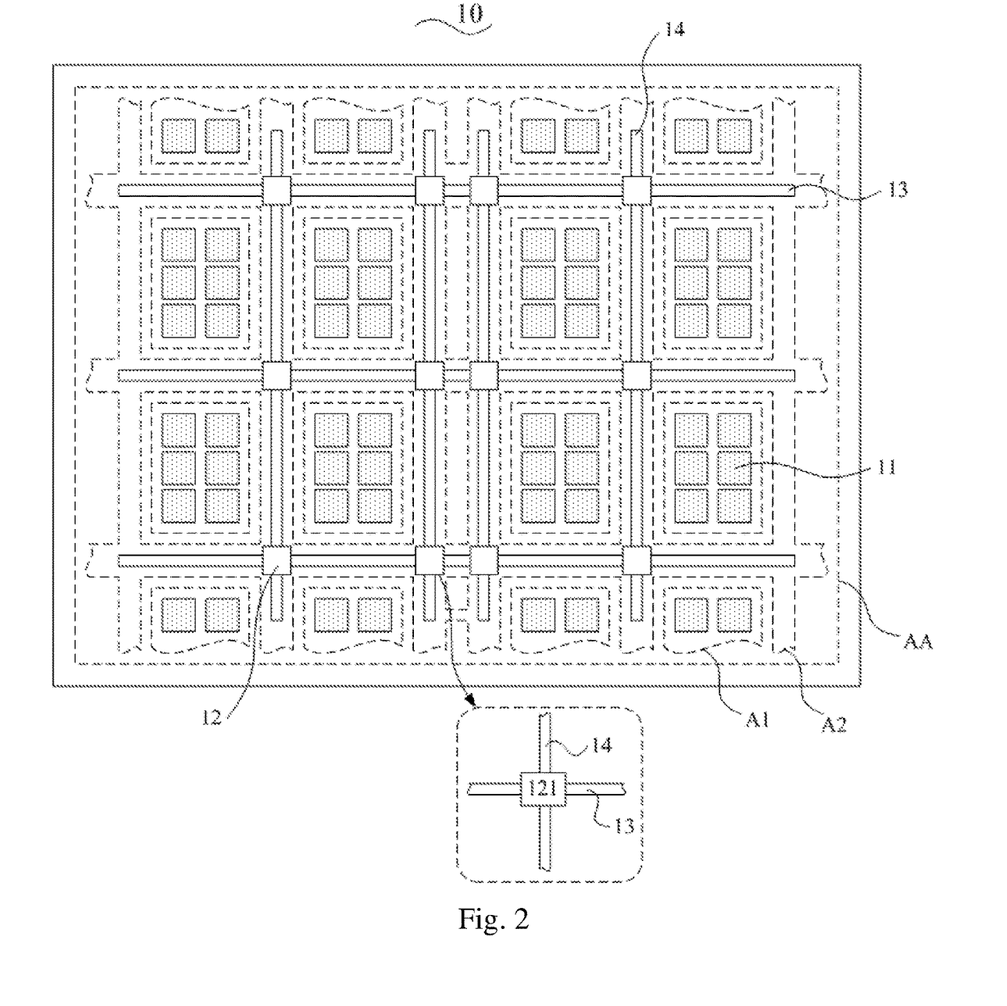
FIG. 2 is a top view of an OLED display substrate provided by an embodiment of the present disclosure.

As shown in FIG. 2, an embodiment of the present disclosure provides an OLED display substrate 10, and the OLED display substrate 10 has a display region (marked for AA in the drawings and hereinafter). The display region AA comprises a plurality of first sub-regions A1 arranged at intervals and second sub-regions A2 located between the first sub-regions A1; the OLED display substrate 10 comprises: at least one OLED light-emitting unit 11 located in the first sub-regions A1; a plurality of optical sensing units 12 located in the second sub-regions A2, and first drive electrode lines 13 and first transmission electrode lines 14 connected with the optical sensing units 12 and intersecting with each other. Each of the optical sensing unit 12 includes a photosensitive sensor 121, and the photosensitive sensor 121 is used for generating an electric signal according to a light intensity change of a sensed touch point; and the first drive electrode lines 13 and the first transmission electrode lines 14 are used for providing the electric signal to determine a position of the touch point.

What needs to be explained is that, firstly, the photosensitive sensor 121 provided by the embodiment of the present disclosure generates a corresponding electric signal according to the light intensity change of the sensed touch point, and the first drive electrode lines 13 and the first transmission electrode lines 14 acquire position information of the touch point according to the electric signal. It can thus be seen that, whether a conductor or an insulator, as long as an object is nontransparent, the object can generate a light intensity change on the touch point, and then touch of the OLED display substrate 10 can be achieved. Thus, a user can control the OLED display substrate 10 in any manner such as a conductor touch manner (touch of fingers or touch pens) or an insulator touch manner (touch when wearing gloves or by common writing pens), and better operation experience is provided for the user.

Herein, a structure achieving photoelectric conversion in the photosensitive sensor 121 can be composed of a P—Si (P type silicon conductor) photoelectric semiconductor material very sensitive to the light intensity change, and a sensitivity of the material on the light intensity change can be controlled by regulating a dosage concentration.

Figure 3:
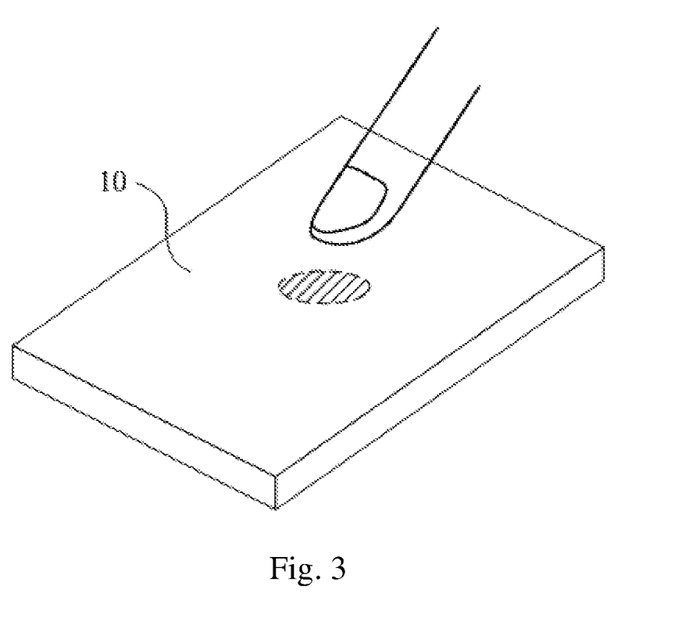
FIG. 3 is a schematic diagram of a working principle of a photosensitive sensor in the OLED display substrate provided by an embodiment of the present disclosure.

For example, as shown in FIG. 3, when a nontransparent object (such as a finger as shown in FIG. 3) touches the display region AA of the OLED display substrate 10, a light ray transmitted into the OLED display substrate 10 is shielded, light intensity of a region (as shown by a shaded region in FIG. 3) of the nontransparent object making contact with the OLED display substrate 10 is smaller than that of peripheral regions, and that is to say a change of the light intensity happens. After the photosensitive sensor 121 senses the change of the light intensity, the light ray change is converted into a certain electric signal, and the first drive electrode lines 13 and the first transmission electrode lines 14 determine a position of a touch point according to the above electric signal.

That the first drive electrode lines 13 and the first transmission electrode line 14 determine the position of the touch point according to the above electric signal can be achieved in, but is not limited to, following manners.

The first drive electrode lines 13 inputs a corresponding scanning signal into the photosensitive sensor 121 to start the photosensitive sensor 121, when a photosensitive sensor 121 at a certain position in the OLED display substrate 10 senses that the light intensity changes and a corresponding electric signal is generated, the electric signal can be transmitted into a corresponding touch Integrated Circuit (IC) through the first transmission electrode line 14; at this moment, because the above electric signal is generated in the photosensitive sensor 121, the electric signal generates a change in a scanning signal in the first drive electrode lines 13 connected with the photosensitive sensor 121, and the first drive electrode lines 13 also transmits information of changing of the above scanning signal into the touch IC. Thus, the first drive electrode lines 13 connected with the touch IC is equivalent to an axis in a two-dimensional coordinate system for positioning the touch point; the first transmission electrode line 14 connected with the touch IC is equivalent to another intersecting axis in the coordinate system, and thus specific position information of the touch point is determined in this way.

In order to guarantee a high touch precision of the above OLED display substrate 10, the first sub-regions A1 should be evenly and symmetrically spaced by the second sub-regions A2, and the optical sensing units 12 are evenly distributed in the above second sub-regions A2, so that the OLED display substrate 10 can comprehensively acquire touch points occurring in the above display region AA, and position information of corresponding touch points can be accurately acquired.

Because the OLED light-emitting units 11 is self-luminous, the OLED light-emitting units 11 and the optical sensing units 12 are respectively located in the first sub-regions A1 and the second sub-regions A2, and that is to say, the above two optical units do not overlap with each other. Thus, a light ray change sensed by the photosensitive sensors 121 in the optical sensing units 12 can only come from touch of a nontransparent object and cannot be affected by self luminescence of the OLED light-emitting units 11, and therefore accuracy of the above OLED display substrate 10 to acquire touch point position information is guaranteed.

Based on this, with the OLED display substrate 10 provided by the embodiment of the present disclosure, a user can control the above OLED display substrate 10 in any manner such as a conductor touch manner (touch of fingers or touch pens) or an insulator touch manner (touch when wearing gloves or by common writing pens), and therefore better operation experience is provided for the user.

In addition, the OLED display substrate 10 integrating with various functions of display and touch consummates a large amount of energy. Besides, in many cases, the user uses the above display product in a lamplight environment where outdoor or indoor light intensity is intense. Due to influence of ambient light, the user needs to heighten brightness of a screen of a display product so that displayed content can be clearly distinguished, which further increases energy consumption of the display product and results in poor cruising capacity of a battery of the display product.

In order to solve the problem, each of the optical sensing unit 12 may further comprise: a solar cell 122 capable of receiving ambient light to generate charge carriers. The solar cell 122 can provide generated electric energy to the OLED display substrate 10, and therefore power is supplied to the OLED display substrate 10 in real time.

The above solar cell 12 can be, for example, a thin-film solar cell of cadmium telluride/cadmium sulfide and the like, or is a heterostructure solar cell and the like. It is only required that the solar cell 122 has the above function of absorbing ambient light to generate electric charges, and a specific type is not defined.

Working of the photosensitive sensor 121 and the solar cell 122 can be performed in two following manners:

In manner I, in the second sub-regions A2, the first drive electrode lines 13 and the first transmission electrode lines 14 which are connected with the photosensitive sensor 121 are also connected with the solar cell 122, and that is to say, the photosensitive sensor 121 and the solar cell 122 share the drive and transmission lines.

Figure 4A:
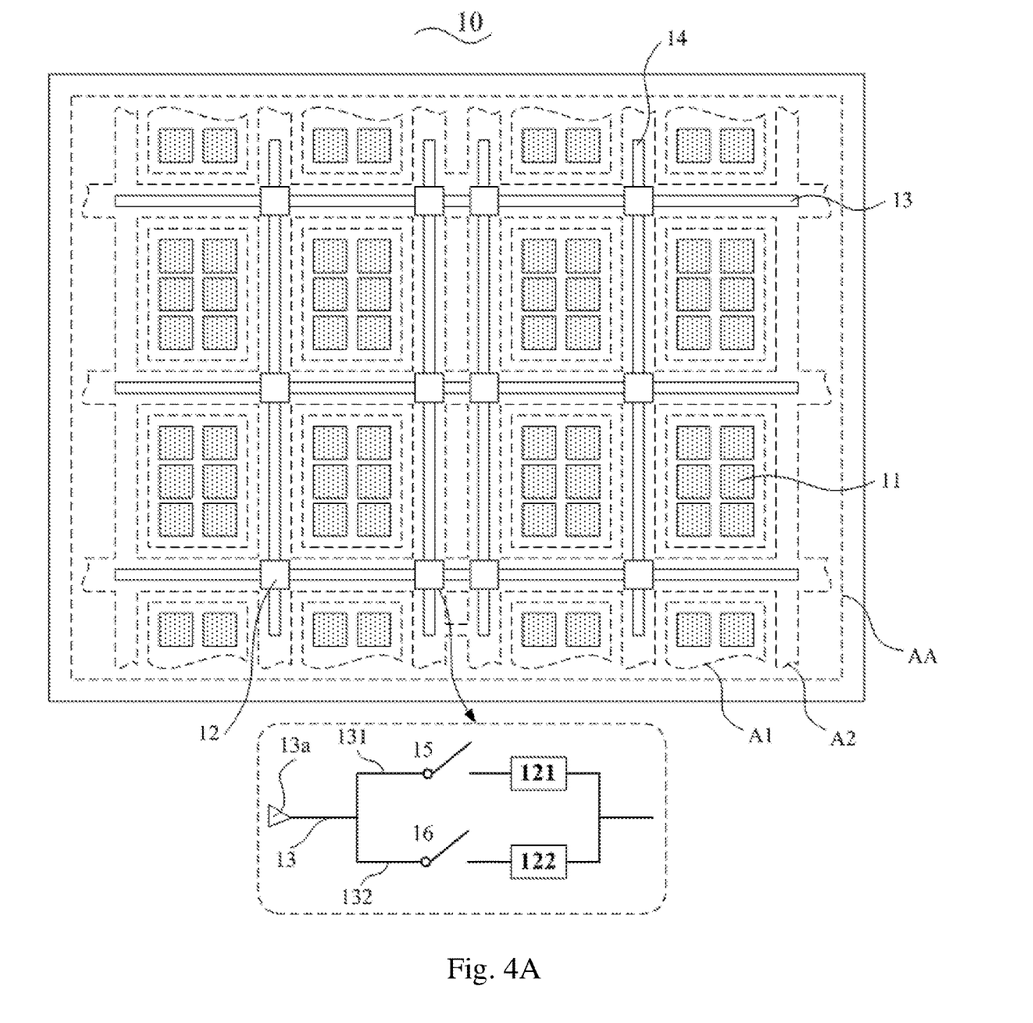
FIG. 4A is a schematic diagram I of working mode of the photosensitive sensor and a solar cell in the OLED display substrate provided by an embodiment of the present disclosure.

As shown in FIG. 4A, in one example, each of the optical sensing unit 12 further comprises: the above solar cell 122 connected with the first drive electrode line 13 and the first transmission electrode line 14; a first switching device 15 connected with the photosensitive sensor 121 in series, the switching device 15 being located on a first branch circuit 131 adopting the first drive electrode line 13 as a bus, and the first switching device 15 being closer to a signal input end (marked for 13a in the drawings and hereinafter) of the first drive electrode line 13 with respect to the photosensitive sensor 121; a second switching device 16 connected with the solar cell 122 in series, the second switching device 16 being located on a second branch circuit 132 which is connected with the first branch circuit 131 in parallel, and the second switching device being closer to the signal input end 13a of the first drive electrode line 13 with respect to the solar cell 122; the first drive electrode line 13 is further used for driving the solar cell 12 to start; the first transmission electrode line 14 is further used for outputting electric energy generated by the solar cell 12; wherein, the first switching device 15 and the second switching device 16 have opposite switching characteristics.

What needs to be explained is that, firstly, FIG. 4A only shows one possible arrangement manner of the above devices and corresponding electrode lines. Arrangement of the devices and the corresponding electrode lines can be flexibly designed, and it is only required that the corresponding functions are achieved through the above electrode lines.

Secondly, because the first switching device 15 and the second switching device 16 have the opposite switching characteristics, when a corresponding electric signal is input into the first switching device 15 and makes the first switching device 15 conductive, the second switching device 16 can be closed when a same electric signal is input into the second switching device 16. That is to say, in the above two switching devices, when one is opened, the other will be closed, and therefore the corresponding electric signal can only be transmitted out through one of the first switching device 15 and the second switching device 16.

In the above embodiment, the first switching device 15 is located on the first branch circuit 131 adopting the first drive electrode line 13 as the bus, and the first switching device 15 being closer to the signal input end 13a of the first drive electrode line 13 with respect to the photosensitive sensor 121; the second switching device 16 is located on the second branch circuit 132 connected with the first branch circuit 131 in parallel, and the second switching device 16 being closer to the signal input end 13a of the first drive electrode line 13 with respect to the solar cell 122. Thus, when the photosensitive sensor 121 works, the solar cell 122 is closed; and vice versa. Therefore, the OLED display substrate 10 has different functions at different stages.

The switching devices with the opposite switching characteristics can be achieved through a conventional technology. For example, the first switching device 15 can be a P-type TFT, that is to say, a type of an active layer in the Thin Film Transistor (TFT) is a P-type semiconductor. The P-type TFT has characteristics of being started at low level and closed at high level; the second switching device 16 can be an N-type TFT, that is to say, a type of an active layer in the TFT is an N-type semiconductor. The N-type TFT has characteristics opposite to the P-type TFT, namely, started at high level and closed at low level.

In structural design of the above manner I, because the photosensitive sensor 121 and the solar cell 122 share the first drive electrode line 13 and the first transmission electrode line 14, difficulty of performing arrangement of various kinds of electrode lines on a base substrate of the OLED display substrate 10 is reduced, a utilization rate of the base substrate is increased, and preparation cost of the display product is also reduced.

In the structural design of the above manner I, the first sub-regions A1 are separated by the second sub-regions A2, which may interfere normal display of the OLED display substrate 10; in order to reduce the above interference, on a basis of the above structural design, as shown in FIG. 4A, the first sub-regions A1 are arranged in a matrix manner; the first transmission electrode line 13 is located between first sub-regions A1 of two adjacent rows, and the first transmission electrode line 14 is located between first sub-regions A1 of two adjacent columns.

The mutually-spaced first sub-regions A1 are arranged in matrix, that is to say, a first sub-region A1 and any adjacent first sub-region A1 have an interval in a row direction and a column direction, the first drive electrode line 13 is arranged between the first sub-regions A1 of two adjacent rows, and the first transmission electrode line 14 is arranged between the first sub-regions A1 of two adjacent columns. Technical effects can be achieved through the above structural design in two aspects. In one aspect, wiring design in interval regions between rows and columns of the first sub-regions A1 is simple; in another aspect, because the first drive electrode line 13 and the first transmission electrode line 14 intersect with each other and are respectively located at row and column interval positions, the first drive electrode line 13 and the first transmission electrode line 14 perpendicularly intersect with each other, and equivalently, the first drive electrode line 13 and the first transmission electrode line 14 form an orthogonal coordinate system, which can simplify a computational process in which a drive IC determines touch point position information according to an acquired electric signal, and reduce difficulty in software design.

In the structural design of the above manner I, arrangement positions of the first drive electrode line 13 and the first transmission electrode line 14 can be interchanged, that is to say, the first transmission electrode line 14 is arranged between the first sub-regions A1 of two adjacent rows, the first drive electrode line 13 is arranged between the first sub-regions A1 of two adjacent columns, effects of the first drive electrode line 13 and the first transmission electrode line 14 are same as above and will not be repeated herein.

Figure 4B:
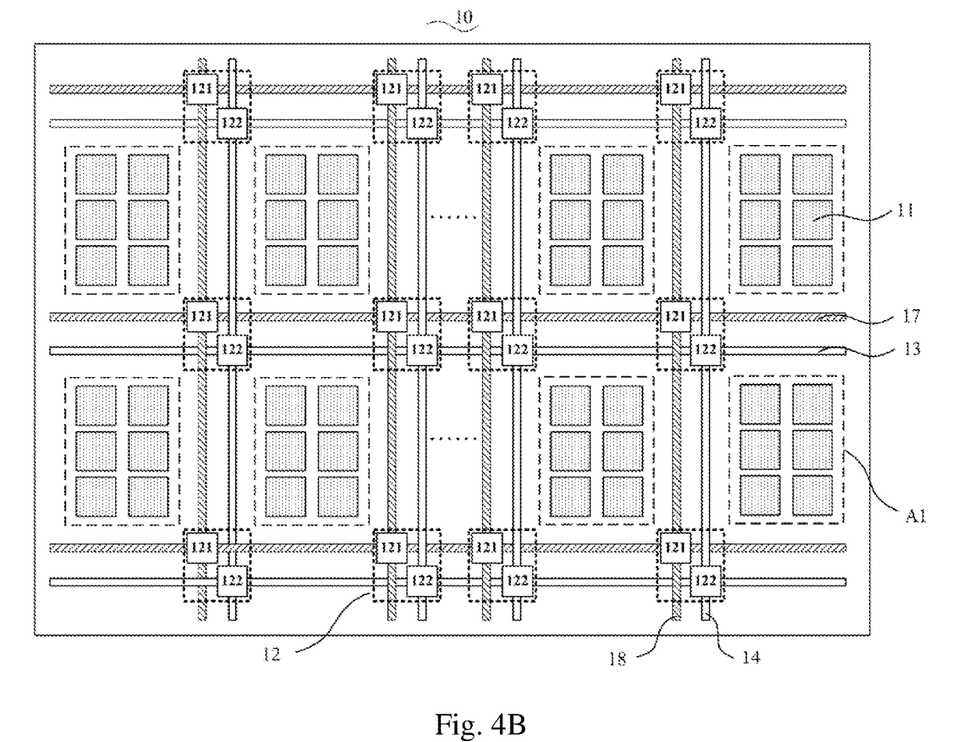
FIG. 4B is a schematic diagram II of working mode of the photosensitive sensor and the solar cell in the OLED display substrate provided by an embodiment of the present disclosure.

In manner II, the photosensitive sensor 121 and the solar cell 122 respectively have drive and transmission lines, illustrated as follows:

As shown in FIG. 4B, in one example, the OLED display substrate 10 further comprises: second drive electrode lines 17 and second transmission electrode lines 18 located in the second sub-regions; wherein, each of the optical sensing unit 12 further include: a solar cell 122 connected with the second drive electrode line 17 and the second transmission electrode line 18; the second drive electrode line 17 is used for driving the solar cell 122 to start; the second transmission electrode line 18 is used for outputting electric energy generated by the solar cell 122.

What needs to be explained is that, compared with the above manner I, a structural design of manner II can achieve that the photosensitive sensor 121 and the solar cell 122 independently work and do not affect each other by arranging the second drive electrode line 17 and the second transmission electrode line 18, that is to say, the OLED display substrate 10 can perform real-time charging by fully using ambient light while achieving touch operation, and therefore cruising capacity of the product is more remarkably improved.

Besides, because the photosensitive sensor 121 and the solar cell 122 work independently, no extra switching device needs to be arranged, circuit design is simplified, and preparation process of the OLED display substrate is simplified.

In the structural design of the above manner II, the first sub-regions A1 are separated by the second sub-regions A2, which may interfere normal display of the OLED display substrate 10; in order to reduce the interference, on a basis of the above structural design, as shown in FIG. 4B, the first sub-regions A1 are arranged in matrix; the first transmission electrode line 13 and the second drive electrode line 17 are located between first sub-regions A1 of two adjacent rows, and the first transmission electrode lines 14 and the second transmission electrode lines 18 are located between first sub-regions A1 of two adjacent columns.

The mutually-spaced first sub-regions A1 are arranged in matrix, that is to say, the first sub-regions A1 and any adjacent first sub-region A1 have an interval in a row direction and a column direction, the first drive electrode line 13 is arranged between first sub-regions A1 of two adjacent rows, and the first transmission electrode line 14 is arranged between first sub-regions A1 of two adjacent columns. Technical effects can be obtained through the above structural design in three aspects. In one aspect, wiring design in interval regions between rows and columns of the first sub-regions A1 is simple; in another aspect, because the first drive electrode line 13 and the first transmission electrode line 14 intersect with each other and respectively located at row and column interval positions, the first drive electrode line 13 and the first transmission electrode line 14 perpendicularly intersect with each other, and equivalently, the first drive electrode line 13 and the first transmission electrode line 14 form an orthogonal coordinate system, which can simplify a computational process in which a drive IC determines touch point position information according to an acquired electric signal, and reduce difficulty in software design; in still another aspect, because the first drive electrode line 13 and the second drive electrode line 17 respectively make the photosensitive sensor 121 and the solar cell 122 started and need to respectively input drive electric signals into the photosensitive sensor 121 and the solar cell 122. Thus, the two electrode lines are both placed between the first sub-regions A1 of the two adjacent rows, corresponding electric signals can be input into the two drive electrode lines at the same time in a row direction, and no extra transmission line needs to be arranged; in the same way, the first transmission electrode line 14 and the second transmission electrode line 18 respectively output electric signals generated by the photosensitive sensor 121 and the solar cell 122, and a corresponding IC needs to be connected to receive the electric signals. Thus, the two electrode lines are both placed between the first sub-regions A1 of the two adjacent columns, the electric signals transmitted out by the two transmission electrode lines in a column direction can be received at the same time, no extra transmission line needs to be arranged, and circuit design is simplified.

In the structural design of the above manner II, relative positions of the above drive wires and the above transmission wires can be interchanged, and effects are same as above and will not be repeated herein.

What needs to be explained is that, the above two manners have different advantages, and can be flexibly selected according to size parameters of the OLED display substrate 10 and process parameters at the time of preparation.

Figure 5:
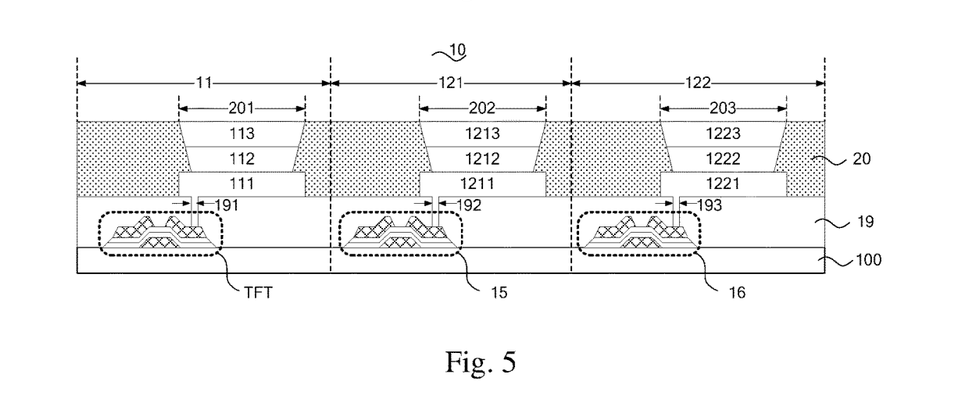
FIG. 5 is a schematic diagram of sectional structures of an OLED light-emitting unit, the photosensitive sensor and the solar cell in the OLED display substrate provided by an embodiment of the present disclosure.

Further, as shown in FIG. 5, the OLED light-emitting unit 11 comprises: a first electrode 111, an organic material functional layer 112 and a second electrode 113 sequentially arranged on a base substrate 100; the photosensitive sensor 121 includes: a third electrode 1211, a first photoelectric conversion layer 1212 and a fourth electrode 1213 sequentially arranged on the base substrate 100; wherein, the first electrode 111 and the second electrode 113 are a cathode and an anode interchangeably; the third electrode 1211 and the fourth electrode 1213 are a cathode and an anode interchangeably; the third electrode 1211, the first photoelectric conversion layer 1212 and the fourth electrode 1213 are respectively arranged in a same layer as the first electrode 111, the organic material functional layer 112 and the second electrode 113.

What needs to be explained is that, firstly, the organic material functional layer 112 is generally composed of a hole transport layer and an electron transport layer close to an anode and a cathode respectively, and a light-emitting layer located between the hole transport layer and the electron transport layer; a specific structure can be achieved by following a conventional technology. Secondly, the so-called "arranged in a same layer" is used for at least two kinds of patterns and refers to a structure that patterns of at least two kinds of structures are arranged in a same layer of thin film.

The third electrode 1211 and the first electrode 111 are arranged in a same layer, referring to that the third electrode 1211 and the first electrode 111 can be formed in a layer of thin film made from a same kind of material by a same patterning process, as a result, the patterning process is simplified; in a similar way, the fourth electrode 1213 and the second electrode 113 are arranged in a same layer, referring to that the fourth electrode 1213 and the second electrode 113 can be formed in a layer of thin film made from a same kind of material by a same patterning process, as a result, the patterning process is simplified; the first photoelectric conversion layer 1212 plays a role in converting a light intensity change into an electric signal, the organic material function layer 112 plays a role of achieving electroluminescence; because roles of the first photoelectric conversion layer 1212 and the organic material function layer 112 are different, the first photoelectric conversion layer 1212 and the organic material function layer 112 are arranged in a same layer, referring to that the first photoelectric conversion layer 1212 and the organic material function layer 112 can adopt a same preparation process; for example, the first photoelectric conversion layer 1212 and the organic material function layer 112 are both made by adopting a solution method or an evaporation method, and therefore production efficiency of preparing the OLED light-emitting unit 11, the photosensitive sensor 121 and various optical units on the base substrate 100 can be improved.

Further, on a basis that the above structural layers are arranged in a same layer, the third electrode 1211, the first photoelectric conversion layer 1212 and the fourth electrode 1213 are respectively same as the first electrode 111, the organic material functional layer 112 and the second electrode 113 in thickness; in this way, compared with an OLED display substrate only having an OLED light-emitting unit, on a basis that the above OLED display substrate 10 provided by the embodiment of the present disclosure is integrated with the above display function, the above touch function and various kinds of functions, an overall thickness of the OLED display substrate 10 is not increased, so that the OLED display substrate 10 still keeps overall light and thin structural design while having a conductor and insulator touch function.

Further, as shown in FIG. 5, the solar cell 122 comprises: a fifth electrode 1221, a second photoelectric conversion layer 1222 and a sixth electrode 1223 sequentially arranged on the base substrate 100; wherein, the fifth electrode 1221 and the sixth electrode 1223 are a cathode and an anode interchangeably; the fifth electrode 1221, the second photoelectric conversion layer 1222 and the sixth electrode 1223 are respectively arranged in a same layer as the first electrode 111, the organic material functional layer 112 and the second electrode 113.

Herein, all structural layers in the solar cell 122 are arranged in the same layer as the structural layers in the photosensitive sensor 121 and the OLED light-emitting unit 11, corresponding structural layers can be formed in a same patterning process or a same preparing process, and a manufacturing process is simplified.

Further, the fifth electrode 1221, the second photoelectric conversion layer 1222 and the sixth electrode 1223 are same as the first electrode 111, the organic material functional layer 112 and the second electrode 113 in thickness.

Herein, the structural layers in the photosensitive sensor 121, the solar cell 122 and the OLED light-emitting unit 11 are arranged in the same layer and are the same in thickness, and thus, on a basis that the overall thickness of the OLED display substrate 10 provided by the embodiment of the present disclosure is not increased, the above various functions of display, touch and solar charging are integrated. Thus, the OLED display substrate 10 still keeps overall light and thin structural design while having a conductor and insulator touch function and a real-time charging function.

Further, regarding a case that each of the optical sensing unit 12 further comprises the solar cell 122, the first switching device 15 and the second switching device 16, drive transistors in the first switching device 15, the second switching device 16 and the OLED light-emitting unit 11 can be connected with respective anodes or cathodes in following manners:

As shown in FIG. 5, the OLED light-emitting unit 11 comprises a drive transistor (marked for TFT) located on the base substrate 100; wherein, the OLED display substrate 10 further comprises a passivation layer 19 covering the drive transistor TFT, the first switching device 15 and the second switching device 16; a drain electrode of the drive transistor TFT is connected with the first electrode 111 through a first via hole 191 in the passivation layer 19; a drain electrode of the first switching device 15 is connected with the third electrode 1211 through a second via hole 192 in the passi-vation layer 19; a drain electrode of the second switching device 16 is connected with the fifth electrode 1221 through a third via hole 193 in the passivation layer 19.

Gate electrode metal layers and drain and source electrode metal layers in the drive transistor (TFT), the first switching device 15 and the second switching device 16 can be formed in a same patterning process, and active layers can be formed in a same preparing method, so as to improve preparing efficiency of the OLED display substrate 10.

Herein, the OLED display substrate further comprises a defining layer 20 located on the passivation layer 19 and defining each OLED light-emitting unit 11. In order to make electrode structures of the OLED light-emitting unit 11, the photosensitive sensor 121 and the solar cell 122 not affect each other, a first opening 201 for exposing the first electrode 111, a second opening 202 for exposing the third electrode 1211 and a third opening 203 for exposing the fifth electrode 1221 are respectively disposed in the defining layer; the organic material function layer 112 and the second electrode 113 are located in the first opening 201, the first photoelectric conversion layer 1212 and the fourth electrode 1213 are located in the second opening 202, and the second photoelectric conversion layer 1222 and the sixth electrode 1223 are located in the third opening 203.

Based on the above structural design, a user can operate the OLED display substrate 10 in any manner such as a conductor touch manner (touch of fingers or touch pens) or an insulator touch manner (touch when wearing gloves or by common writing pens), and better operation experience is provided for the user.

Figure 6:
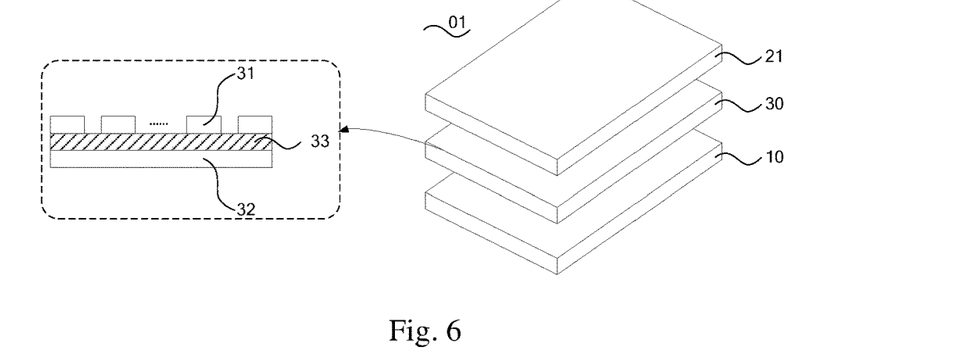
FIG. 6 is a schematic diagram of a breakdown structure of a touch display panel provided by an embodiment of the present disclosure.

Further, as shown in FIG. 6, an embodiment of the present disclosure further provides a touch display panel 01, and the touch display panel 01, for example, comprises: a encapsulation substrate 21 and the above OLED display substrate 10 to be cell-assembled with the encapsulation substrate 21.

Further, as shown in FIG. 6, the touch display panel 01 may further comprise: a touch electrode layer 30 located between the encapsulation substrate 21 and the OLED display substrate 10; wherein, the touch electrode layer 30 is used for sensing a touch signal at a conductor touch stage; and the photosensitive sensor is used for sensing the touch signal at an insulator touch stage.

What needs to be explained is that, the touch electrode layer 30 can acquire a structure of a position of a touch point by sensing a change of coupling capacitance Cm of the touch point.

A user can select a touch implementing manner of the touch display panel 01 by himself or herself. For example, it can be achieved by a program instruction stored in a readable storage medium in the above touch display panel 01. In a process that the user uses the above touch display panel 01, whether a conductor or an insulator is adopted to perform touch control on the above touch display panel 01 can be selected by controlling a physical button (such as a side edge button of a touch smart phone) for implementing the program instruction, so that a capacitive touch display panel also has an insulator touch function.

Besides, compared with a design that a touch electrode layer is located on a encapsulation substrate, in the above touch display panel 01 provided by the embodiment of the present disclosure, the touch electrode layer 30 is integrated below the encapsulation substrate 21, and therefore no protective layer needs to be additionally arranged on the touch electrode layer 30 to protect the touch electrode layer 30, overall thickness of the touch display panel 01 is reduced, and the touch display panel 01 better meets a lighting and thinning requirement of a display device.

Figure 7:
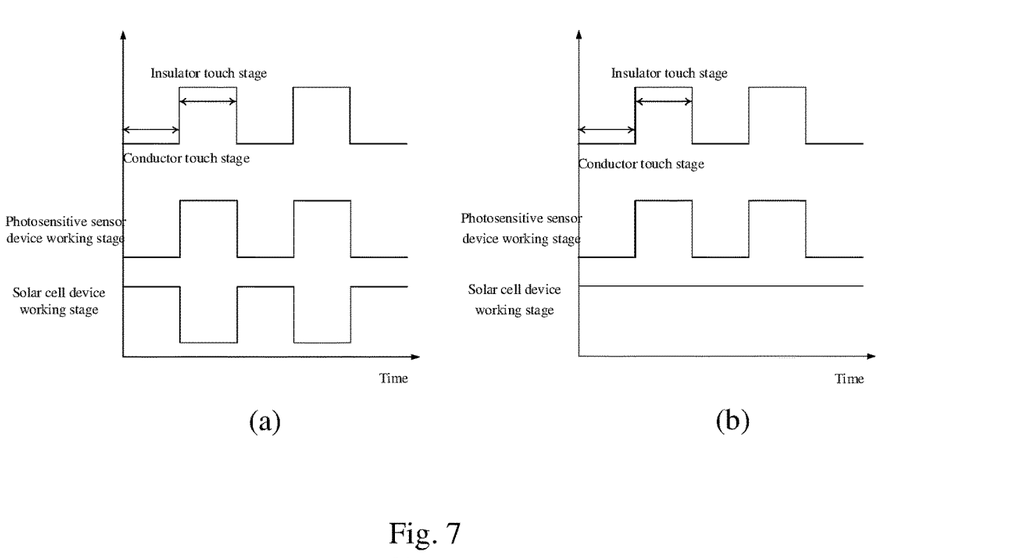
FIG. 7 is a work timing diagram of the touch display panel provided by an embodiment of the present disclosure at different stages.

Herein, because the solar cells 122 capable of performing charging in real time can further be arranged in the above OLED display substrate 10, when the solar cells 122 and the photosensitive sensors 121 in the optical sensing units 12 are designed to share drive and transmission electrode lines, as shown in portion (a) in FIG. 7, a work timing of the solar cells 122 is same as that of the touch electrode layer 30. That is to say, when the photosensitive sensors 121 work at an insulator touch stage, the solar cells 122 work at an opposite conductor touch stage.

For example, at the insulator touch stage, the first switching device 15 is started, and the second switching device 16 is closed at the same time; the photosensitive sensor 121 is started, and the solar cell 122 is closed at the same time. At the conductor touch stage, the first switching device 15 is closed, and the second switching device 16 is started at the same time, the photosensitive sensor 121 is closed, and the solar cell 122 is started at the same time.

When the solar cells 122 and the photosensitive sensors 121 in the optical sensing units 12 are designed to separately adopt drive and transmission electrode lines, as shown in portion (b) in FIG. 7, the solar cells 122 can work all the time at the conductor touch stage and the insulator touch stage.

Further, referring to a structure in a dashed box denoted by an arrow in FIG. 6, the touch electrode layer 30 includes a touch driving electrode 31 and a touch sensing electrode 32 which are isolated by an insulating layer 33 and intersect with each other, wherein, the OLED light-emitting unit 11 does not overlap with the touch driving electrode 31 or the touch sensing electrode 32, and therefore light outgoing efficiency of the OLED light-emitting unit 11 is improved; and/or, the optical sensing units 12 do not overlap with the touch driving electrodes 31 or the touch sensing electrodes 32, and therefore light sensing efficiency of the optical sensor device 121 and the solar cell 122 in the optical sensing unit 12 can be improved.

Further, as shown in FIG. 4A and FIG. 4B, five to ten of the OLED light-emitting units are arranged in the first sub-region A1; the optical sensing unit 12 is located at a position of a center region of every four adjacent first sub-regions.

In the above structural design, an interval between two adjacent touch sensing electrodes Rx or two adjacent touch driving electrodes Tx is generally around 0.5 mm, and therefore one optical unit 12 is arranged at the position of the center region of every four adjacent first sub-regions A1, and effect on resolution of the OLED display substrate 10 caused by arranging the optical unit 12 can be reduced as far as possible; meanwhile, such distribution that one optical sensing unit 12 is arranged at the position of the center region of every four adjacent first sub-regions A1 can guarantee that the above touch display panel 01 has high precision in acquiring the touch point at the insulator touch stage, and therefore better using experience is provided for the user.

On a basis of the above structural design, a position design of the touch electrode layer 21 in the above touch display panel 01 can be flexibly adjusted, and the above conductor/insulator touch can be achieved as well.

Figure 8A:
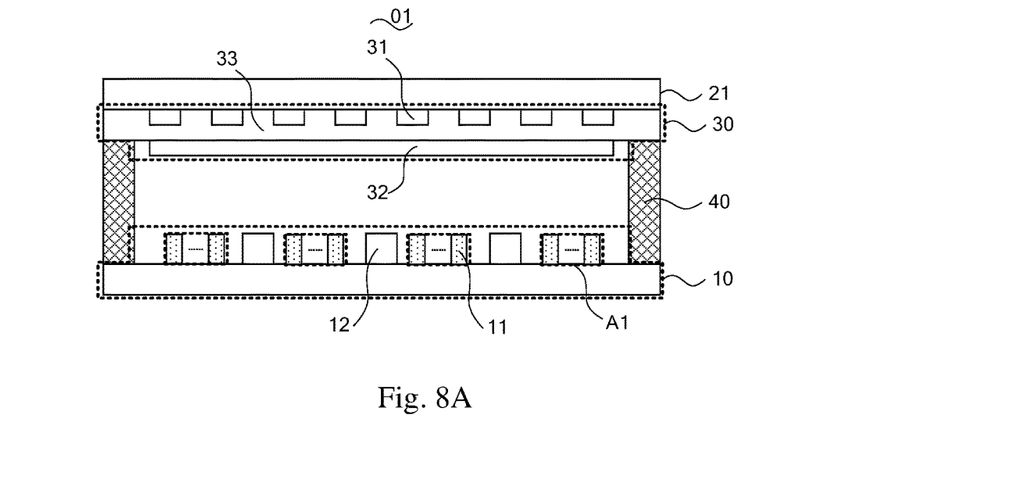
FIGS. 8A to 8D are sequentially schematic diagrams of a sectional structure of the touch display panel provided by an embodiment of the present disclosure.

Example 1: as shown in FIG. 8A, the touch electrode layer is located on a side of the encapsulation substrate 21 facing the OLED display substrate 10; the touch display panel 01 further comprises sealant 40 located between the OLED display substrate 10 and the encapsulation substrate 21.

For example, the sealant 40 can be formed by a molten glass material, that is to say, a Frit (melting) packaging manner is adopted.

Figure 8B:
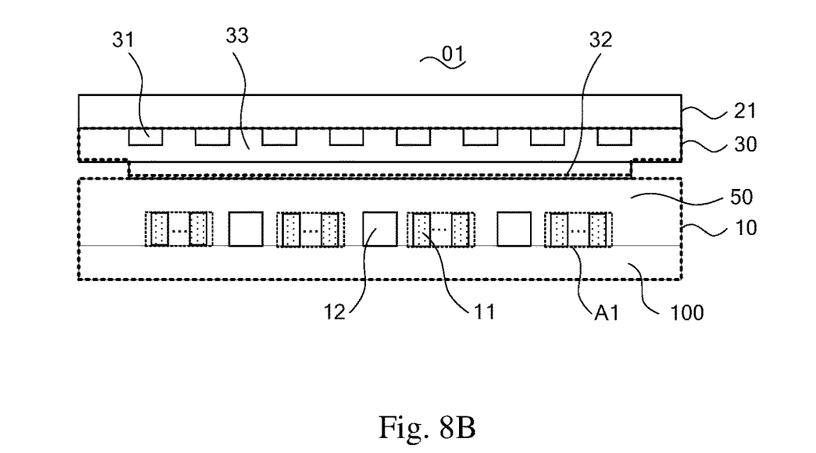

Example 2: as shown in FIG. 8B, the touch electrode layer 30 is located on a side of the encapsulation substrate 21 facing the OLED display substrate 10; the OLED display substrate 10 further includes a encapsulation layer 50 for packaging the OLED light-emitting unit 11 and the optical unit 12.

For example, a flexible substrate can be adopted as the base substrate 100 of the OLED display substrate 10 and can be formed by a polyethylene terephthalate (PET) material; correspondingly, a flexible substrate of a thin-film material can also be adopted as the encapsulation substrate, and therefore the touch display panel 01 formed above can be applied to flexible touch display.

Figure 8C:
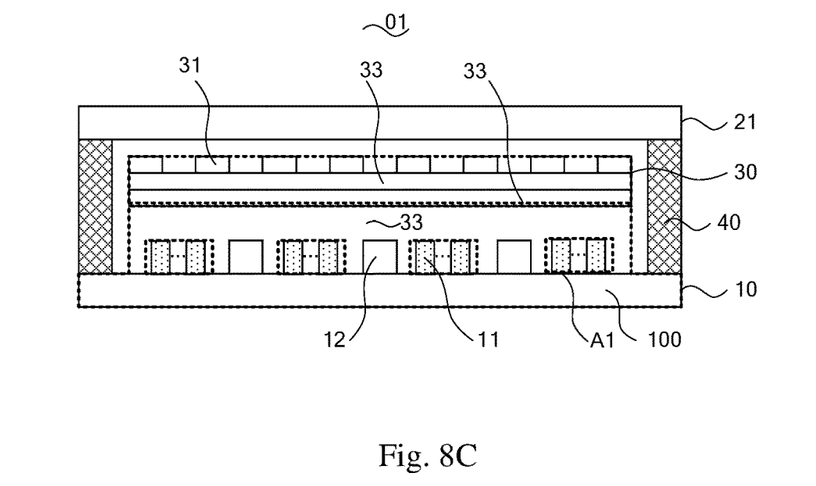

Example 3: as shown in FIG. 8C, the touch electrode layer 30 is located on a side of the OLED display substrate 10 facing the encapsulation substrate 21; the touch display panel 01 further comprises an insulating layer 33 located between the touch electrode layer 30 and the OLED light-emitting unit 11 as well as between the touch electrode layer 30 and the optical unit 12, and sealant 40 located between the OLED display substrate 10 and the encapsulation substrate 21.

For example, the sealant 40 can be formed by a molten glass material, that is to say, a frit (melting) packaging manner is adopted.

Figure 8D:
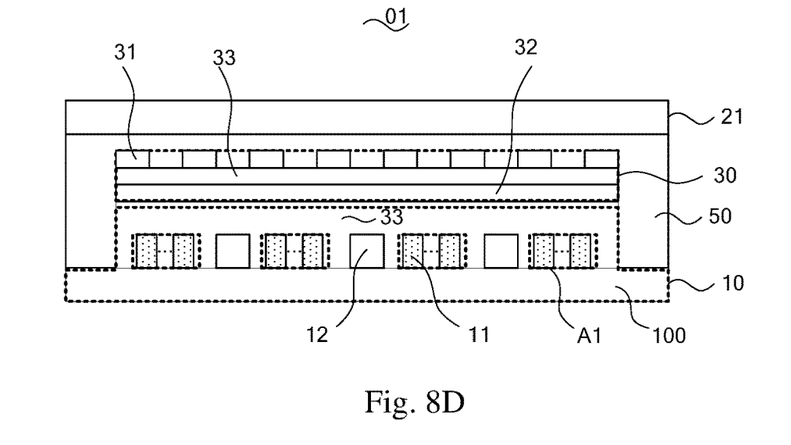

Example 4, as shown in FIG. 8D, the touch electrode layer 30 is located on a side of the OLED display substrate 10 facing the encapsulation substrate 21; the OLED display substrate 10 further includes an insulating layer 33 located between the touch electrode layer 30 and the OLED light-emitting unit 11 as well as between the touch electrode layer 30 and the optical unit 12, and a encapsulation layer 50 packaging the touch electrode layer 30, the OLED light-emitting unit 11 and the optical unit 12.

The encapsulation layer 50 can adopt TFE (Thin Film Encapsulation) with good water and oxygen isolation characteristics and thickness being only several microns, and therefore overall thickness of the touch display panel 01 is further reduced.

Herein, in the above examples from 1 to 4, a specific structure of the optical unit 12 can refer to the above embodiments and will not be repeated herein.

An embodiment of the present disclosure further provides a display device, comprising the above touch display panel 01.

For example, the above display device can be a digital photo frame, a mobile phone, a tablet personal computer or any product or part with a display function and is not specifically defined.

What needs to be explained is that, all the drawings of the present disclosure are abbreviated schematic diagrams of the above touch display panel, structures relevant to the present disclosure are embodied to clearly describe the scheme, and other structure irrelevant to the present disclosure are existing structures and are not embodies in the drawings or are partially embodied.

What are described above is related to the illustrative embodiments of the disclosure only and not limitative to the scope of the disclosure; the scopes of the disclosure are defined by the claims.

The present application claims the priority of the Chinese Patent Application No. 201510172765.8 filed on Apr. 13, 2015, which is incorporated herein by reference as part of the disclosure of the present application.

What is claimed is:

1. An Organic Light-Emitting Display (OLED) display substrate, comprising a base substrate and a display region, the display region comprising:

a plurality of first sub-regions arranged at intervals and second sub-regions located between the first sub-regions;
at least one OLED light-emitting unit located in the first sub-regions; and
a plurality of optical sensing units located in the second sub-regions, and first drive electrode lines and first transmission electrode lines connected with the optical sensing units and intersecting with each other;
wherein the optical sensing units each comprise a photosensitive sensor, and the photosensitive sensor is configured to generate an electric signal according to a light intensity change of a sensed touch point; and
the first drive electrode lines and the first transmission electrode lines are configured to provide electric signals to determine a position of the touch point; and
wherein the optical sensing units further comprise:
solar cells connected with the first drive electrode lines and the first transmission electrode lines;
first switching devices connected with the photosensitive sensors in series, the first switching devices being located on first branch circuits adopting the first drive electrode lines as buses, and the first switching devices being closer to signal input ends of the first drive electrode lines with respect to the photosensitive sensors;
second switching devices connected with the solar cells in series, the second switching devices being located on second branch circuits which are connected with the first branch circuits in parallel, and the second switching devices being closer to the signal input ends of the first drive electrode lines with respect to the solar cells;
the first drive electrode lines are configured to drive the solar cells to start; and
the first transmission electrode lines are configured to output electric energy generated by the solar cells;
wherein, the first switching devices and the second switching devices have opposite switching characteristics;
the OLED light-emitting unit comprises: a first electrode, an organic material functional layer and a second electrode sequentially arranged on the base substrate;
the photosensitive sensor comprises: a third electrode, a first photoelectric conversion layer and a fourth electrode sequentially arranged on the base substrate;
wherein the first electrode and the second electrode are a cathode and an anode interchangeably; the third electrode and the fourth electrode are a cathode and an anode interchangeably; and
the third electrode, the first photoelectric conversion layer and the fourth electrode are respectively arranged in a same layer as the first electrode, the organic material functional layer and the second electrode.

2. The OLED display substrate according to claim 1, wherein, the first sub-regions are arranged in matrix;
the first drive electrode lines are located between first sub-regions of two adjacent rows, and the first transmission electrode lines are located between first sub-regions of two adjacent columns.

3. The OLED display substrate according to claim 2, wherein,
the photosensitive sensor comprises: a third electrode, a first photoelectric conversion layer and a fourth electrode sequentially arranged on the base substrate;
wherein, the first electrode and the second electrode are a cathode and an anode interchangeably; the third electrode and the fourth electrode are a cathode and an anode interchangeably;
the third electrode, the first photoelectric conversion layer and the fourth electrode are respectively arranged in a same layer as the first electrode, the organic material functional layer and the second electrode.

4. The OLED display substrate according to claim 1, further comprising: second drive electrode lines and second transmission electrode lines located in the second sub-regions;
wherein, the optical sensing units further comprise: solar cells connected with the second drive electrode lines and the second transmission electrode lines;
the second drive electrode lines are configured to drive the solar cells to start; and
the second transmission electrode lines are configured to output electric energy generated by the solar cells.

5. The OLED display substrate according to claim 4, wherein, the first sub-regions are arranged in matrix;
the first drive electrode lines and the second drive electrode lines are located between first sub-regions of two adjacent rows; the first transmission electrode lines and the second transmission electrode lines are located between first sub-regions of two adjacent columns.

6. The OLED display substrate according to claim 5, wherein,
the photosensitive sensor comprises: a third electrode, a first photoelectric conversion layer and a fourth electrode sequentially arranged on the base substrate;
wherein, the first electrode and the second electrode are a cathode and an anode interchangeably; the third electrode and the fourth electrode are a cathode and an anode interchangeably;
the third electrode, the first photoelectric conversion layer and the fourth electrode are respectively arranged in a same layer as the first electrode, the organic material functional layer and the second electrode.

7. The OLED display substrate according to claim 4, wherein,
the photosensitive sensor comprises: a third electrode, a first photoelectric conversion layer and a fourth electrode sequentially arranged on the base substrate;
wherein, the first electrode and the second electrode are a cathode and an anode interchangeably; the third electrode and the fourth electrode are a cathode and an anode interchangeably;
the third electrode, the first photoelectric conversion layer and the fourth electrode are respectively arranged in a same layer as the first electrode, the organic material functional layer and the second electrode.

8. The OLED display substrate according to claim 6, wherein, the third electrode, the first photoelectric conversion layer and the fourth electrode are respectively same as the first electrode, the organic material functional layer and the second electrode in thickness.

9. The OLED display substrate according to claim 1, wherein,
each of the solar cells comprises: a fifth electrode, a second photoelectric conversion layer and a sixth electrode sequentially arranged on the base substrate;
wherein, the fifth electrode and the sixth electrode are a cathode and an anode interchangeably;
the fifth electrode, the second photoelectric conversion layer and the sixth electrode are respectively arranged in a same layer as the first electrode, the organic material functional layer and the second electrode.

10. The OLED display substrate according to claim 9, wherein, the fifth electrode, the second photoelectric conversion layer and the sixth electrode are respectively same as the first electrode, the organic material functional layer and the second electrode in thickness.

11. The OLED display substrate according to claim 9, wherein, the optical sensing units comprise the solar cells, the first switching devices and the second switching devices;
the OLED light-emitting unit comprises a drive transistor located on the base substrate;
wherein, the OLED display substrate further comprises a passivation layer covering the drive transistor, the first switching devices and the second switching devices;
a drain electrode of the drive transistor is connected with the first electrode through a first via hole in the passivation layer;
a drain electrode of the first switching device is connected with a third electrode through a second via hole in the passivation layer; and
a drain electrode of the second switching device is connected with the fifth electrode through a third via hole in the passivation layer.

12. A touch display panel, comprising an encapsulation substrate and the OLED display substrate according to claim 1 to be cell-assembled with the encapsulation substrate.

13. The touch display panel according to claim 12, further comprising: a touch electrode layer located between the encapsulation substrate and the OLED display substrate;
wherein, the touch electrode layer is configured to sense a touch signal at a conductor touch stage;
the photosensitive sensor is configured to sense a touch signal at an insulator touch stage.

14. The touch display panel according to claim 13, wherein,
the touch electrode layer comprises a touch driving electrode and a touch sensing electrode isolated by an insulating layer and intersecting with each other;
wherein, the touch display panel is configured to meet at least one of two following conditions: an OLED light-emitting unit does not overlap with the touch driving electrode or the touch sensing electrode; and the optical sensing unit does not overlap with the touch driving electrode or the touch sensing electrode.

15. The touch display panel according to claim 14, wherein,
five to ten of the OLED light-emitting units are arranged in the first sub-regions;
the optical sensing unit is located at a position of a center region of every four adjacent first sub-regions.

16. The touch display panel according to claim 14, wherein,
the touch electrode layer is located on a side of the encapsulation substrate facing the OLED display substrate, and the touch display panel further comprises: sealant located between the OLED di splay substrate and the encapsulation substrate;
or, the touch electrode layer is located on a side of the encapsulation substrate facing the OLED display substrate, and the OLED display substrate further comprises an encapsulation layer for packaging the OLED light-emitting unit and the optical sensing unit;
or, the touch electrode layer is located on a side of the OLED display substrate facing the encapsulation substrate, and the touch display panel further comprises: an insulating layer located between the touch electrode layer and the OLED light-emitting unit as well as between the touch electrode layer and the optical sensing unit, and sealant located between the OLED display substrate and the encapsulation substrate;
or, the touch electrode layer is located on a side of the OLED display substrate facing the encapsulation substrate, and the OLED display substrate further comprises an insulating layer located between the touch electrode layer and the OLED light-emitting unit as well as between the touch electrode layer and the optical sensing unit, and an encapsulation layer for encapsulating the touch electrode layer, the OLED light-emitting unit and the optical sensing unit.

17. The touch display panel according to claim 13, wherein,
the touch electrode layer is located on a side of the encapsulation substrate facing the OLED display substrate, and the touch display panel further comprises: sealant located between the OLED di splay substrate and the encapsulation substrate;
or, the touch electrode layer is located on a side of the encapsulation substrate facing the OLED display substrate, and the OLED display substrate further comprises an encapsulation layer for packaging the OLED light-emitting unit and the optical sensing unit;
or, the touch electrode layer is located on a side of the OLED display substrate facing the encapsulation substrate, and the touch display panel further comprises: an insulating layer located between the touch electrode layer and the OLED light-emitting unit as well as between the touch electrode layer and the optical sensing unit, and sealant located between the OLED display substrate and the encapsulation substrate;
or, the touch electrode layer is located on a side of the OLED display substrate facing the encapsulation substrate, and the OLED display substrate further comprises an insulating layer located between the touch electrode layer and the OLED light-emitting unit as well as between the touch electrode layer and the optical sensing unit, and an encapsulation layer for encapsulating the touch electrode layer, the OLED light-emitting unit and the optical sensing unit.

18. A display device, comprising the touch display panel according to claim 12.

* * * * *